(12) United States Patent
Hasegawa et al.

(10) Patent No.: US 6,271,674 B1
(45) Date of Patent: Aug. 7, 2001

(54) PROBE CARD

(75) Inventors: Yoshiei Hasegawa, Kanagawa-ken; Yukihiro Hirai, Tokyo; Tadashi Sugiyama; Takahiko Tandai, both of Aomori-ken; Norie Yamaguchi, Tokyo; Satoshi Narita, Aomori-ken, all of (JP)

(73) Assignee: Kabushiki Kaisha Nihon Micronics, Tokyo (JP)

( * ) Notice: Subject to any disclaimer, the term of this patent is extended or adjusted under 35 U.S.C. 154(b) by 0 days.

(21) Appl. No.: 09/361,719

(22) Filed: Jul. 27, 1999

(30) Foreign Application Priority Data

Apr. 7, 1999 (JP) .................................................. 11-100411
Apr. 7, 1999 (JP) .................................................. 11-100412

(51) Int. Cl.⁷ .................................................... G01R 31/02
(52) U.S. Cl. .......................................... 324/754; 324/762
(58) Field of Search ................................. 324/754, 758, 324/761, 762

(56) References Cited

U.S. PATENT DOCUMENTS 4,087,747 * 5/1978 Deegen et al. ........................ 324/761
4,899,107 * 2/1990 Corbett et al. ........................ 324/758
5,276,395 * 1/1994 Malloy .................................. 324/761

FOREIGN PATENT DOCUMENTS 5-297020  11/1993 (JP) .
7-201935   8/1995 (JP) .
9-283575  10/1997 (JP) .

* cited by examiner

*Primary Examiner*—Ernest Karlsen
(74) *Attorney, Agent, or Firm*—Christensen O'Connor Johnson Kindness PLLC

(57) ABSTRACT

A probe card including a plurality of probe blocks can be easily put together substantially in a lattice-like form, and four chips adjoining around the intersection portion of imaginary boundary lines intersecting at right angle each other form a cross-like shape to be tested simultaneously. A plurality of probe blocks with the first and second probe group including a plurality of probes are set up on a base plate substantially in the lattice-like form by a probe set-up means. The needle points of the first and second probe groups are respectively located across the imaginary line so as to oppose to each other. A probe blocks located around the lattice intersection portion are fitted to the base plate such that the needle point parts of the probes located in the vicinity of the lattice intersection portion are positioned on the same side with respect to their needle rear part.

15 Claims, 16 Drawing Sheets

FIG. 17A  FIG. 17B  FIG. 17C
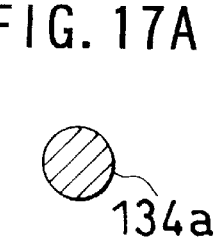
134a
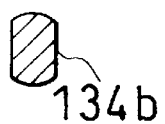
134b
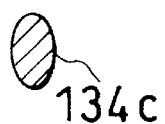
134c
FIG. 18
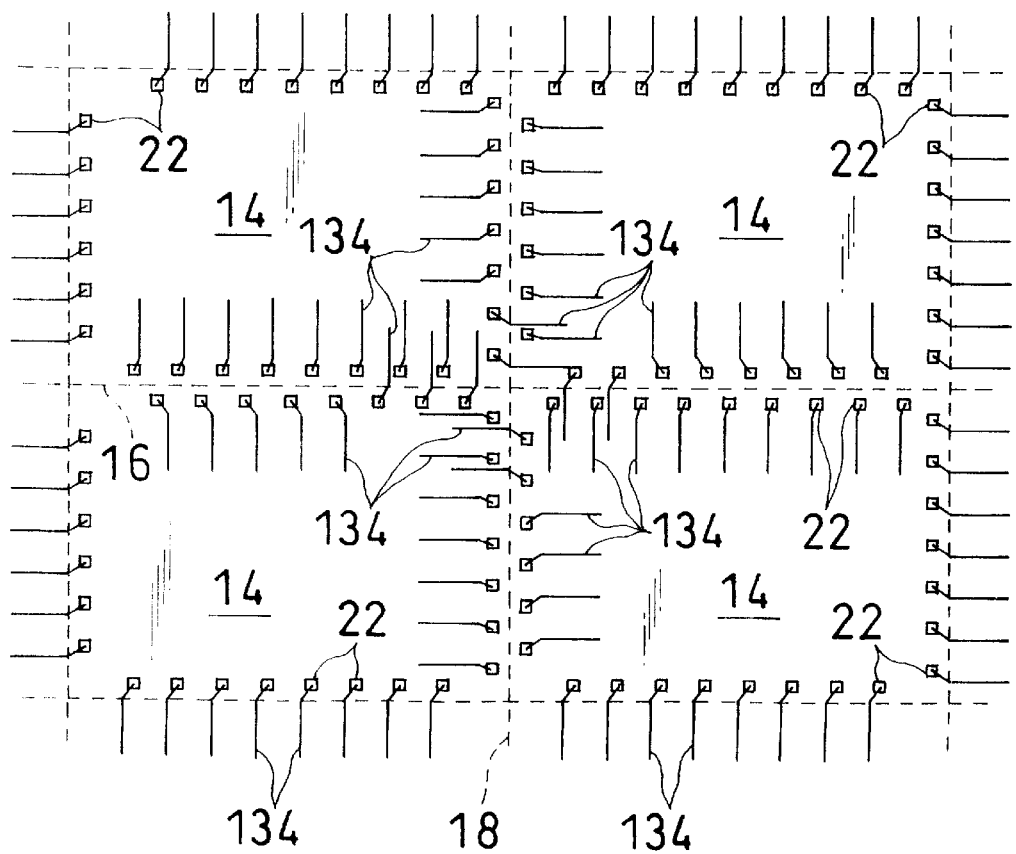

PROBE CARD

BACKGROUND OF THE INVENTION

1. Field of the Invention

The present invention relates to a probe card suitable for electrically testing a plurality of chips formed in a form of a matrix on a semiconductor wafer.

2. Prior Art

In general, there are formed a plurality of integrated circuit portions, i.e., IC chip portions (referred to merely as a chip or chips hereinafter) in a form of a matrix on a semiconductor wafer. Each chip has a rectangular shape, and each of its edge portions corresponding to each side of the rectangular chip has a plurality of electrode pads or an electrode portion. Chips constituting rows and columns of the matrix are aligned in every row and column.

Chips of this kind are subject to the electrical test for determining whether or not the circuit formed on each chip can operate in such a manner as defined in the specification thereof. Such an electrical test is often carried out, before separating chips in pieces from the wafer, that is, in the state that the chips stay on the wafer, by means of a probe card including a plurality of probes for pressing the electrode portion with their needle point. In the electrical test of this kind, if the test is performed on the chip by chip basis, it would take a very long time to complete the test of all the chips.

In order to obviate such a long and unnecessary time consuming work, there has been proposed a probe card which enables a predetermined number of chips on the wafer to be tested in one test. In order to perform the test using such probe card, the chips lying on the wafer are first divided into groups including some chips, for instance, a group consisting of some chips which are selected every other chip or every third chips lying on the wafer, or a series of chips aligned in the form of row or column on the wafer. Then, the test is carried out on such chip groups on the group by group basis, thereby reducing the number of tests needed for completing the test of all the chips on the wafer and shortening the time required for completing the same.

In case of the above-mentioned prior art probe card, however, since the chip group which can be tested simultaneously consists of chips selected every other chip or every third chip, or a series of chips aligned in the form of row or column, it is not possible to test simultaneously four chips arranged side by side across each of the imaginary boundary lines intersecting each other substantially in the cross-like shape, in other words, four chips located around the intersection of boundary lines. Accordingly, the number of electrical tests per wafer becomes large, and it takes a long time for completing the test of one wafer.

A probe card capable of testing adjacent four chips simultaneously has been disclosed by the Japanese Patent Application Public Disclosure (KOKAI) No. H9-283575. In this probe card, the same number of probes as the number of a lot of chips are fitted to a plurality of long supporters, and these supporters are arranged on the printed circuit board in a lattice-like form.

However, according to the probe card as described above, since a lot of probes have to be fitted to each supporter, the work for fitting the probes to the supporter are apt to become complicated. Especially, should there exist only one probe erroneously fitted to the supporter, the supporter itself will be rejected through the product inspection, thus worsening the production yield of the supporter and the probe, which in turn results in the rise in their manufacturing cost. Accordingly, it is required that the work for fitting the probes to the supporter be carried out more carefully.

Therefore, in the probe card for use in the test of chips formed on the semiconductor wafer, it is the most important thing that, while adjacent four chips located around the intersection portion of the boundary lines intersecting each other in the cross-like shape can be tested simultaneously, the work for putting probe blocks together in the lattice-like form should be facilitated.

SUMMARY OF THE INVENTION

A probe card according to the invention includes a base plate, a plurality of probe blocks having first and second probe groups including a plurality of probes, respectively, the probe blocks being fitted to the base plate substantially in a lattice-like form. Respective needle points of the probes belonging to the first and second probe groups are located on one and the other sides of each of imaginary boundary lines. The probe blocks located around a lattice intersection portion position the needle point parts of the probes located in the vicinity of the lattice intersection portion in the same direction with respect to their needle rear parts.

The probe blocks are arranged on the base plate. Therefore, it is not required to fit to each probe block the same number of probes as the number of electrode portions of a lot of chips. As a result, the number of probes to be fitted to each probe block can be reduced remarkably.

In the probe card, the needle points of the first and second probe groups located around the lattice intersection portion are made to oppose to the electrode portions belonging to the electrode group of one and the other of two adjacent chips located side by side across each of imaginary boundary lines respectively extending from the lattice intersection portion and are pressed against the corresponding electrode portions.

A plurality of probe blocks located around a lattice intersection portion position the front side portions of the probes located in the vicinity of said lattice intersection portion in the same direction, i.e., in a windmill-like manner. Therefore, a plurality of probes do not interfere with the work for combining a plurality of probe blocks in the lattice-like form, and it is possible to test simultaneously adjacent four chips arranged across each of the imaginary boundary lines intersecting each other substantially in the cross-like shape.

A plurality of probe blocks located around the lattice intersection portion may position, around the lattice intersection portion, the needle point parts of their probes on the same side with respect to their needle rear parts. With this, all the probes of the probe blocks are extended to the same side like the vanes of a windmill, so that the work for setting up the probes is made easier.

In the preferable embodiment of the invention, each probe block further includes a supporter for supporting the probes, and the probe card further comprises a probe set-up means. The probe set-up means includes a plurality of cross joints for joining the probe blocks together substantially in cross-like form and fitting the joined probe blocks to the base plate substantially in the lattice-like form.

In the embodiments as described above, a plurality of probe blocks located around the lattice intersection portion can extend, around the lattice intersection portion, all of their front side portions in the same direction relative to the fitting position of the probes to the supporter. In this way, since all the front side portions of each probe block project on the same side, i.e., in a windmill-like manner from the supporter, the work for fitting the probes to the supporter is made easier.

A plurality of probe blocks located around the lattice intersection portion can include four probe blocks which radially extend and are combined so as to form substantially a cross shape. Each cross joint may combine four probe blocks together substantially in a cross shape and fit the combined probe blocks to the base plate. In this way, since it is possible to make each probe block correspond to one imaginary boundary line radially extending from the lattice intersection portion, the work for fitting the probes to the probe set-up means, the base plate or the supporter is made easier.

Alternatively, the cross joint may be arranged on the base plate with a predetermined space therebetween in the first direction in parallel to the base plate so as to extend in the second direction intersecting the first direction, each cross joint puts a plurality of probe blocks together such that they extend substantially in one line in the second direction, and adjacent cross joints put a plurality of probe blocks together such that they extend in the first direction with a predetermined space therebetween in the second direction.

In any one of the cases as described above, the work for assembling the lattice-shaped probe assembly is made easier, and the work for fitting the probe blocks to the base plate is made easier in comparison with the work for fitting the probe blocks directly to the base plate.

Also, in any one of the cases as described above, the probe block can be screwed on the cross joint, and the cross joint can be screwed on the base plate. In this way, the work for fitting the probe blocks to the base plate is made easier.

In another preferable embodiment, the probe card further comprises a probe set-up means including an insulating plate fitted to the base plate. The insulating plate has a plurality of slots which extend along two imaginary boundary lines intersecting each other almost in the lattice-like shape. The probes of each probe block penetrate through the slot and are adhered to the insulating plate in a state of penetrating through the slot.

Four pairs of probe groups located around the lattice intersection portion extend, around said lattice intersection portion, the front side portions of the probes located in the vicinity of the lattice intersection portion on the same side (like the vanes of a windmill) with respect to the fitting position of the probes to the insulating plate. Therefore, a plurality of probes located in the vicinity of the lattice intersection portion do not interfere with the work for arranging a plurality of probe groups on the insulating plate substantially in the lattice-like form, so that it is possible to test simultaneously adjacent four chips arranged across each of the imaginary boundary lines intersecting each other substantially in a cross-like shape.

Four pairs of the first and second probe groups located around the lattice intersection portion may extend, around said lattice intersection portion, all the front side portions of their probes in the same direction with respect to the adhesion position of the probes to the insulating plate. In this way, since all the probes around the lattice intersection extend on the same side with respect to the adhesion position of the probes to the insulating plate, the work for fitting the probes to the insulating plate is facilitated.

The probe block can further include a base to which a plurality of probes are adhered so as to penetrate through the base. This base is further inserted into and adhered to the slot so as to have the probes penetrated through the slot. In this way, since it possible to first uprightly stand probes penetrating through the base, thereby forming a probe block, and then, to adhere the probe block to each slot so as to have the probes penetrated through the slot, the work for fitting the probes to each slot is facilitated.

The probe card may further include a plurality of cables which correspond to each probe group and are connected with the probes of the corresponding probe group. If the base plate includes a plurality of slots, each cable can penetrate through the corresponding slot of the base plate.

The base plate can include a plurality of connectors arranged around the set-up zone of the probe blocks and correspondingly connected with the cables, and a plurality of tester lands formed around the connectors and connected therewith, respectively. If the base plate includes a plurality of slots, the connectors can be arranged around the slots of the base plate. On the other hand, if the probe card includes the insulating plate, the connectors can be arranged around the slots of the insulating plate.

BRIEF DESCRIPTION OF THE DRAWINGS

FIG. 18 is an illustration showing an example of probe arrangement in the probe assembly according to another embodiment.

PREFERRED EMBODIMENTS OF THE INVENTION

Figure 1:
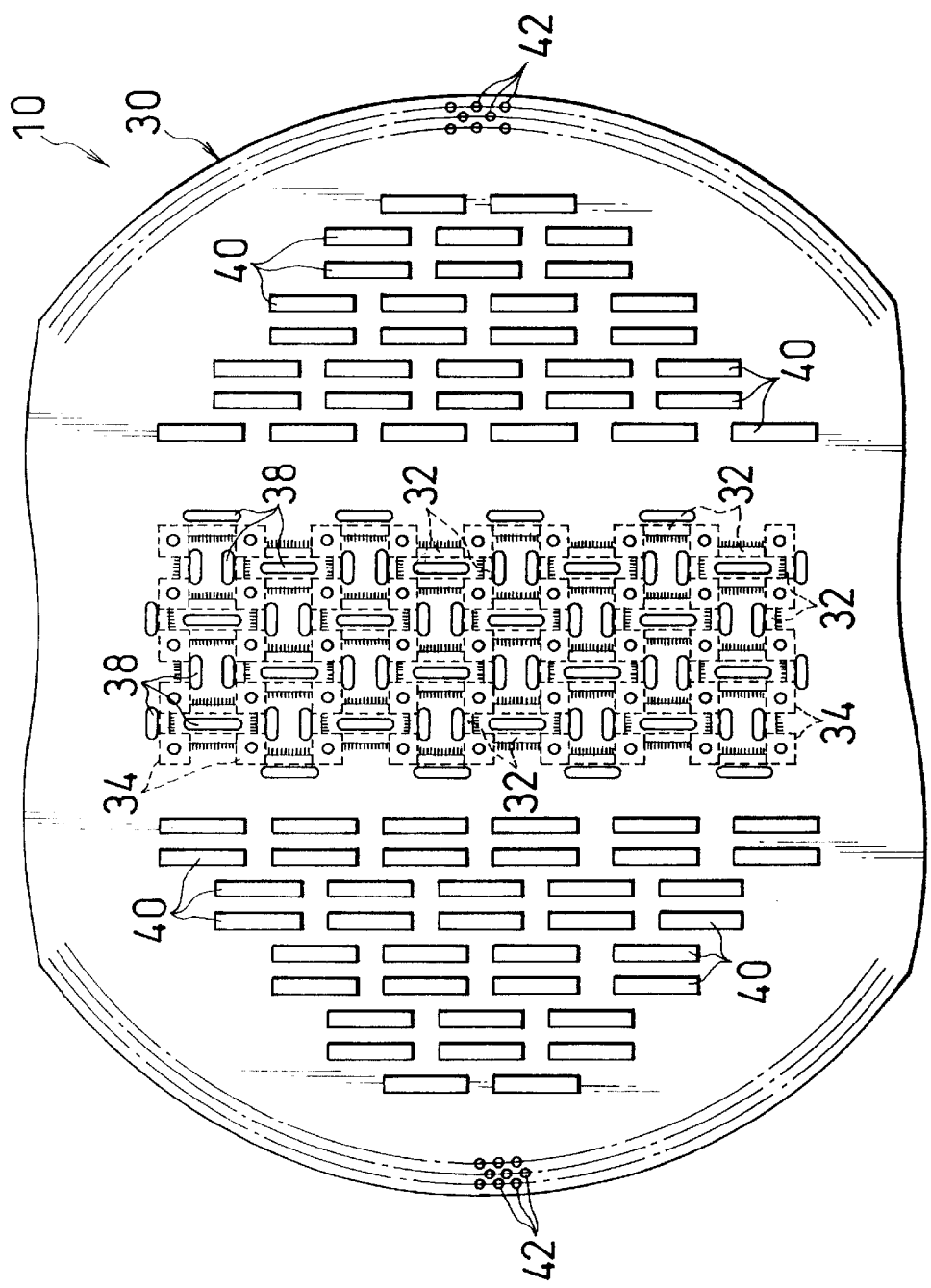
FIG. 1 is a plan view of a probe card shown without cables, according to an embodiment of the invention.
Figure 2:
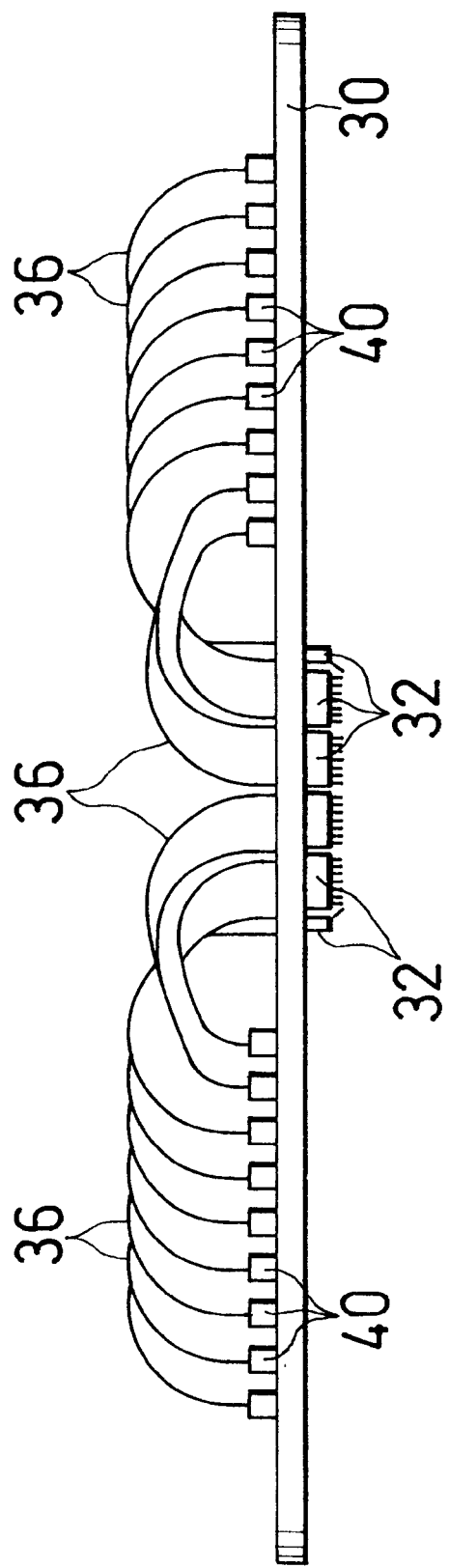
FIG. 2 is an elevational view of the probe card as shown in FIG. 1.
Figure 7:
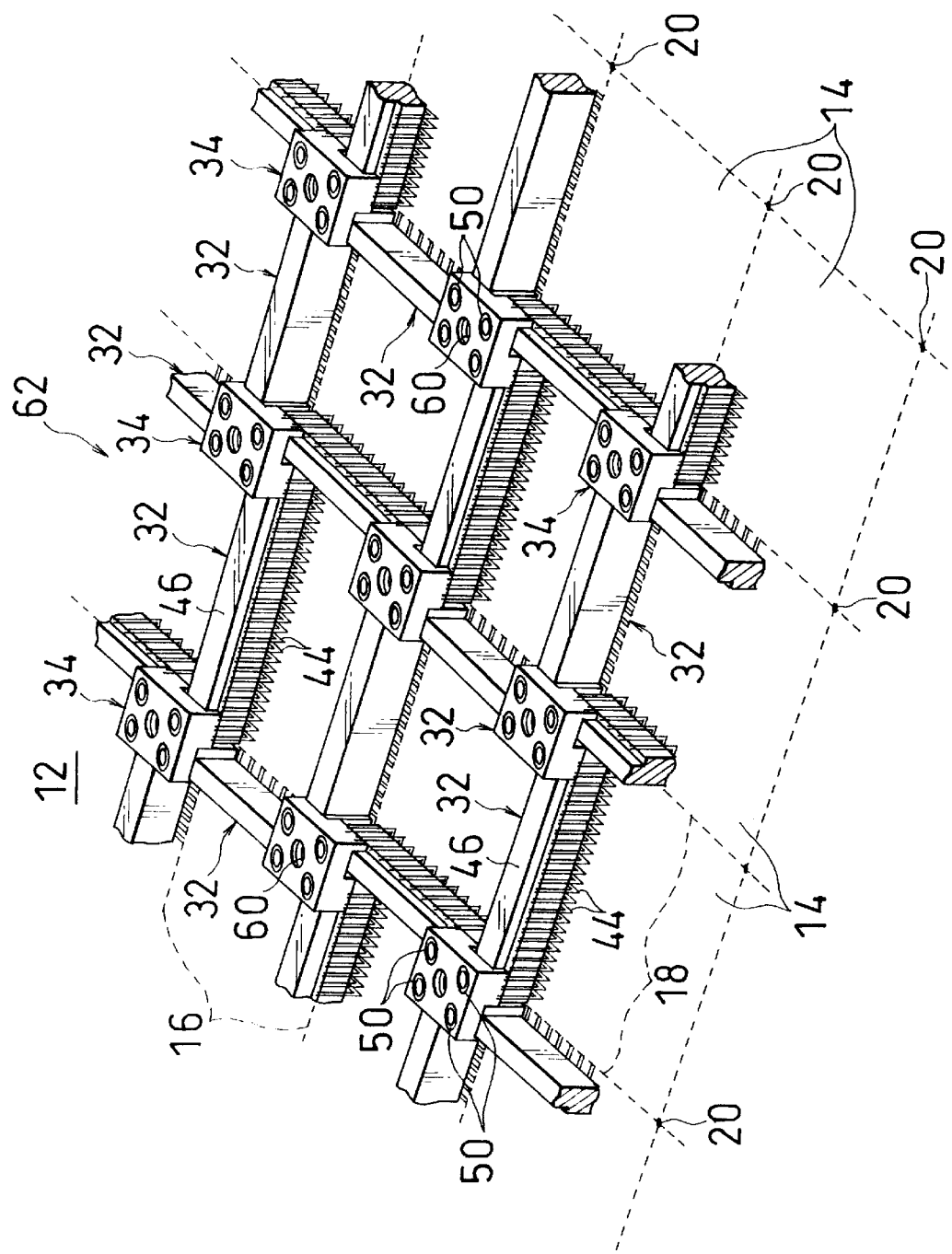
FIG. 7 is an enlarged perspective view of the probe assembly shown in FIG. 6.
Figure 8:
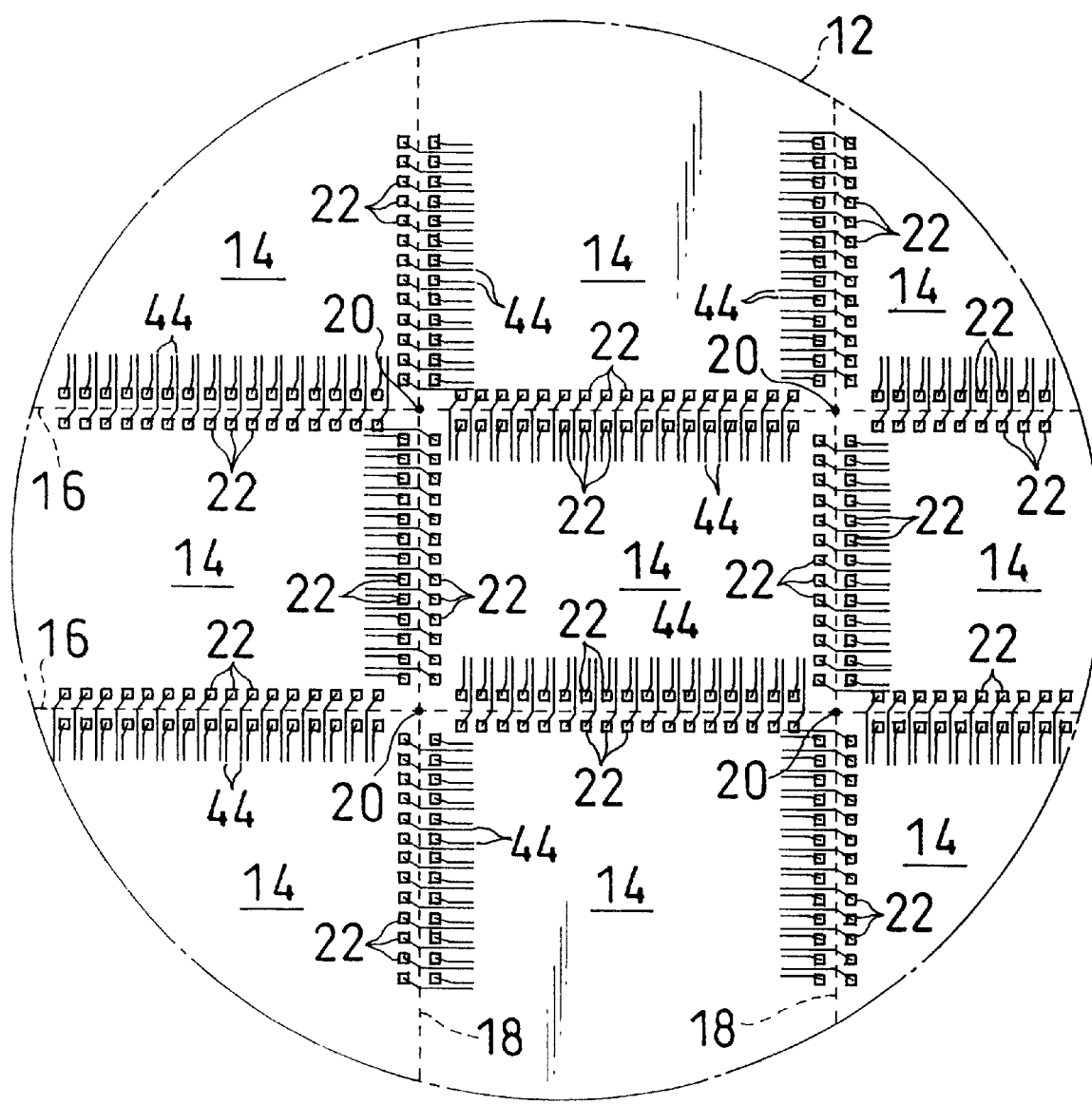
FIG. 8 is an illustration showing the relation between the probe and the electrode portion of a chip in the probe assembly shown in FIG. 6.

Referring to FIGS. 1 and 2, a probe card 10 is used for electrically testing a lot of IC chips 14 which are arranged on a semiconductor wafer 12 in the form of a matrix as shown in part in FIGS. 7 and 8. The wafer 12 includes a lot of chips 14 formed thereon so as to draw a plurality of rows and columns. Therefore, these chips 14 are divided by a plurality of imaginary boundary lines 16 and 18 (scribe lines indicated as broken lines in the embodiment as shown) intersecting each other and extending in the X- and Y-directions.

The intersection portion 20 of the boundary lines 16 and 18 corresponds to the intersection portion of the lattice (i.e. lattice point) as will be described later. Each chip 14 has a rectangular shape and also has electrode groups on each of its edge portions corresponding to the sides of the rectangular shape. Each electrode group includes a plurality of electrode pads or electrode portions 22, which are aligned on the corresponding edge portion at intervals in the direction of the boundary line 16 or 18.

The probe card 10 includes a circular printed circuit board, i.e., a base plate 30, a plurality of probe blocks 32 which are arranged substantially in the lattice-like form on the underside of the printed circuit board 30, a plurality of cross joints 34 which put probe blocks 32 together substantially in the lattice-like form and are arranged on the printed circuit board 30, and cables 36 connected with each probe block 32.

The printed circuit board 30 includes a plurality of slots 38 located in the central portion thereof, a plurality of connectors 40 located around a zone for arranging slots 38 to be electrically connected with corresponding cables, and a plurality of tester lands 42 located in the outer peripheral portion of the printed circuit board 30 to be electrically connected with a tester (not shown).

Each slot 38 is formed near one of a pair of opposing edge portions of each chip 14 so as to penetrate through the printed circuit board 30 and to extend in the direction of that edge portion. The cable 36 is a flexible flat cable (so-called FPC) including a plurality of conductive portions which are arranged in parallel with each other on an insulating film-like material. The cable extends through the slot 38.

Each connector 40 has a plurality of electrical contact portions connected with corresponding conductive portions of the cable 36, respectively, and are arranged on the upper face side of the printed circuit board 30. Each electrical contact portion of the connector 40 is connected with the tester land 42 through the wiring portion having a predetermined pattern drawn on the printed circuit board 30.

As shown in FIGS. 3 through 6, each probe block 32 includes a plurality of probes 44 which are fixedly arranged in parallel on a plate-like supporter 46 by means of a suitable non-conducting means such as an non-conducting adhesive 48. Each probe 44 is made of a fine conductive metal wire material in the needle-like form. On the other hand, each supporter 46 is made of an insulating material and is set up to stand on the printed circuit board 30 such that the widthwise direction of the supporter corresponds to the up and down directions.

Each probe 44 having the needle-like form bends its needle point part to be pressed on the electrode portion 22 of the chip 14 in one direction relative to its principal needle body part, and also bends its needle rear part in the other direction opposite to the bending direction of the needle point part with respect to the principal body part.

Each probe 44 is adhered to the supporter 46 at its needle rear part by means of the adhesive 48 such that its needle rear part extends upward on one side of the supporter 46 relative to the thickness direction of the supporter 46, and its principal needle body part passes through under the supporter 46 to project toward the other side of the supporter 46 with respect to the thickness direction of the supporter 46, and further, the needle point part extends its needle point downward on the above-mentioned other side of the supporter 46.

Each probe block 32 has the first probe group including a plurality of probes 44 placing their needle points on one side of the boundary line 16 or 18, and the second probe group including a plurality of probes 44 placing their needle points on the other side of the boundary line 16 or 18.

Therefore, all the needle points of the probes 44 belonging to the first probe group and all the needle points of the probes 44 belonging to the second probe group leave space therebetween in the thickness direction of the supporter 46 (i.e., X- or Y-direction) but are located on the same side with respect to the thickness direction of the supporter 46. The probes 44 of each probe group are electrically connected with the conducive portions of the cable 36, respectively.

In the example as shown, the needle points of the probes 44 belonging to the first and second probe groups are aligned in the direction of the corresponding slots on the basis of probe group by prove group. However, the needle points of the probes 44 belonging to the first and second probe groups may be arranged so as to draw a zigzag line or to form multiple lines.

As shown in FIG. 8, one and the other probe groups of each probe block 32 respectively correspond to one and the other electrode groups adjacent to each other across the boundary lines 16 or 18 between the chips 14 adjacent to each other in the thickness direction of the supporter 46 (i.e. the chips 14 adjacent to each other across the boundary line 16 or 18), and the needle points of the probes 44 are pressed upon the electrode portion 22 of the corresponding electrode group.

Figure 3:
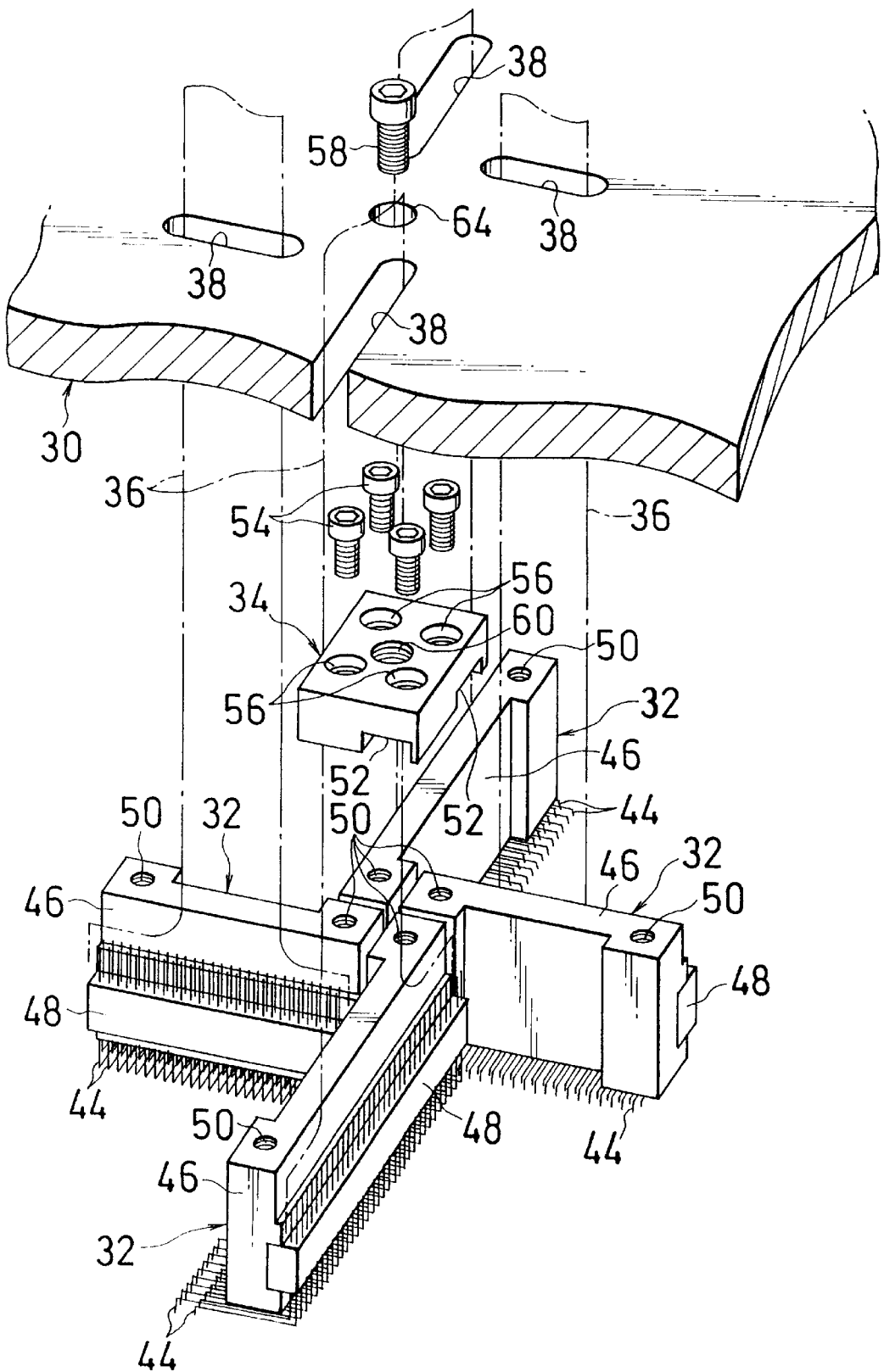
FIG. 3 is an exploded perspective view of the joint portion of four probe blocks.
Figure 4:
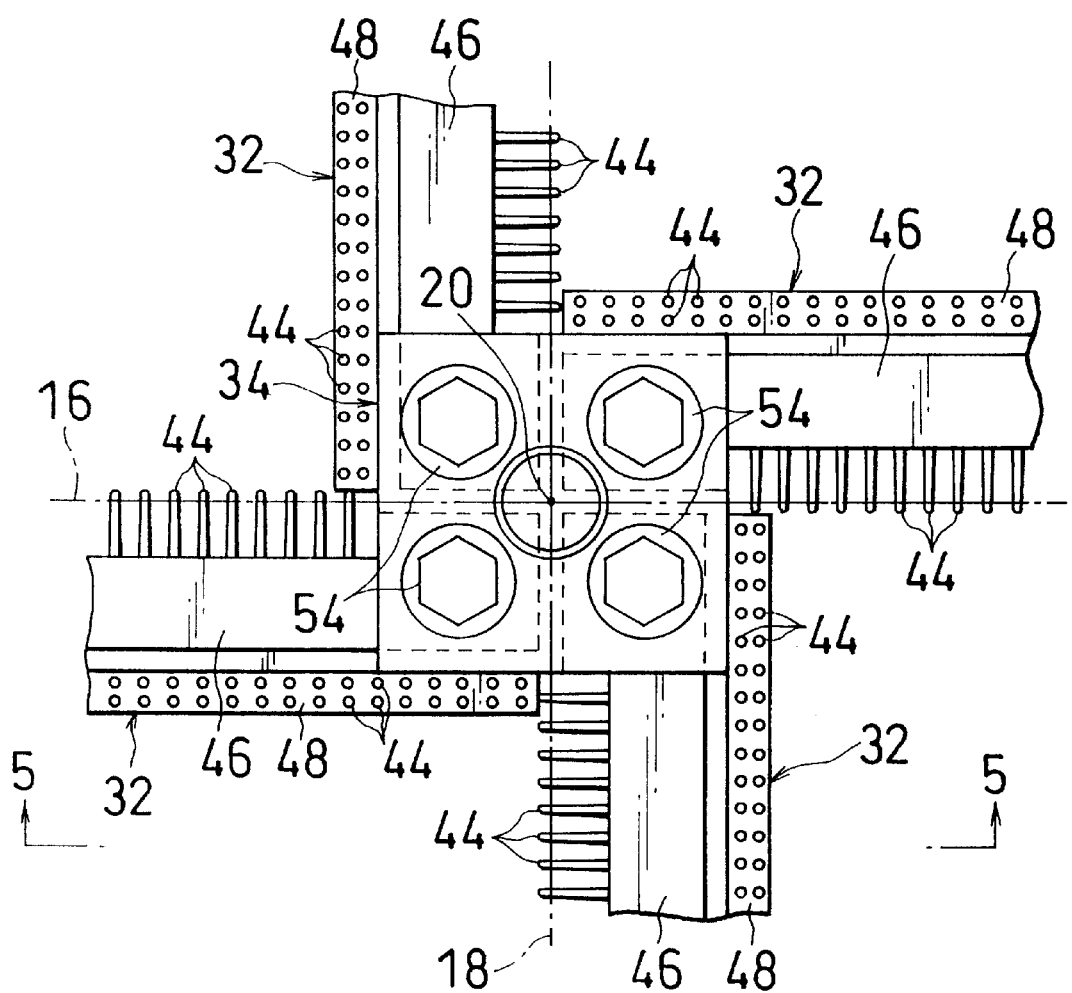
FIG. 4 is a plan view of the joint portion of four probe blocks.
Figure 5:
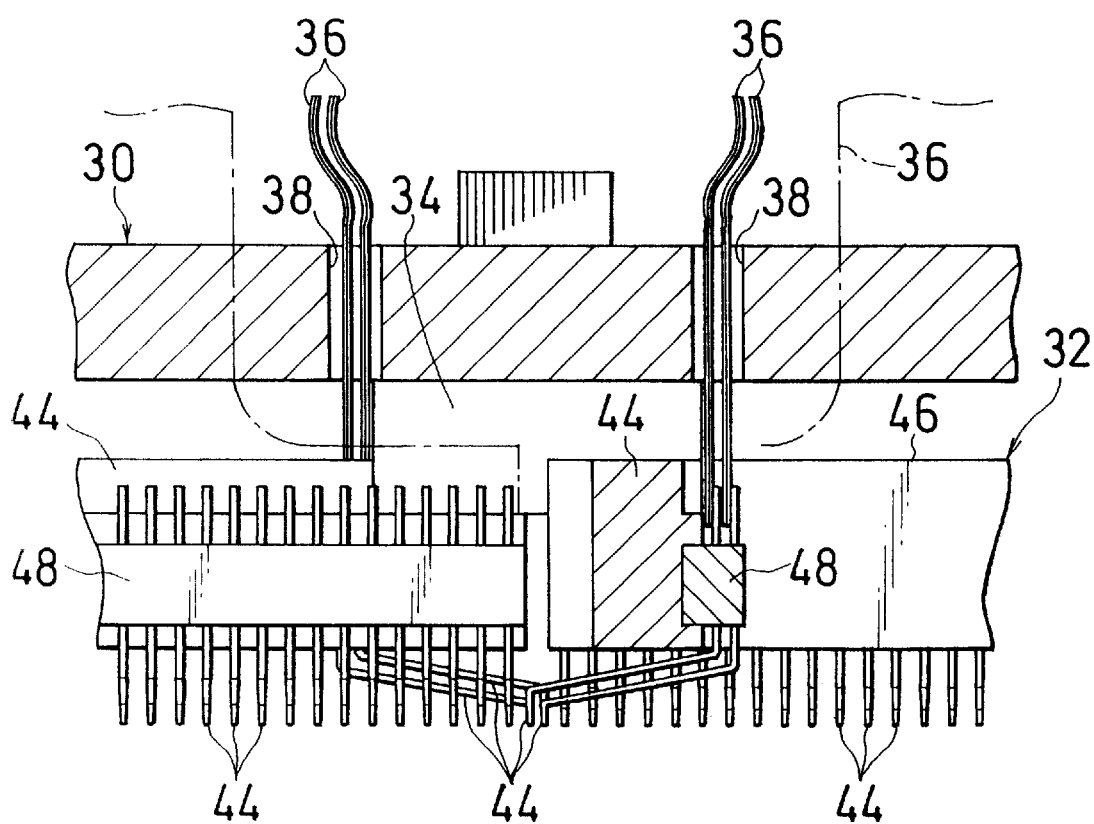
FIG. 5 is a sectional view taken along the line 5—5 in FIG. 4.

As shown in FIG. 3, the supporter 46 is made in the form of a thick plate-like block and includes a recess located on its one side with respect to its thickness direction and extending over its entire width. Consequently, both end portions of the supporter 46 in its longitudinal direction are made thicker than the middle portion of the supporter 46. Therefore, both end portions of each supporter 46 are drawn in a hook shape in their plan view. Each supporter 46 has a threaded hole 50 opened upward at both of its end portions.

As shown in FIG. 3, each cross joint 34 has a square plate shape and includes four recesses 52, each of which is coupled with one end portion of the supporter 46 through the upper part thereof. Each recess 52 is opened not only in its thickness direction but toward the one side corresponding to the side of the square plate. Each cross joint 34 further includes a plurality of through holes 56 for receiving a screw member 54 which screws the cross joint 34 on the supporter 46, and also includes a threaded hole 60 for receiving a screw member 58 which screws the cross joint 34 on the printed circuit board 30.

The probe card 10 can be assembled as follows.

First, there are prepared the printed circuit board 30, probe blocks 32, cross joints 34 and cables 36.

Next, as shown in FIG. 3, four probe blocks 32 are joined to the cross joint 34 to form a substantially cross-like shape. This structure formed by joining four probe blocks 32 to the cross joint 34 is defined here as a lattice sub-assembly. Then, a plurality of these lattice sub-assemblies are further put together substantially in the lattice-like form.

When joining the four probe blocks 32 to the cross joint 34, all the probes 44 are arranged such that their needle points are positioned on one side of the supporter 46 around the intersection portion 20 of the boundary lines 16 and 18 (i.e., intersection portion of the lattice) 20, in other words, in such a manner as all the front side portions of the probes including the principal needle body parts of the probes 44 extend, around the above intersection portion 20, in the same direction with respect to the position where the supporter 46 supports needles (i.e., the position of the adhesive 48).

With this, the four probe blocks 32 come to project their front side portions of the probes from the supporter 46 in the same direction like the vanes of a windmill, and locate the needle points of the probes 44 so as to be rotationally symmetric with respect to the intersection portion 20.

Figure 6:
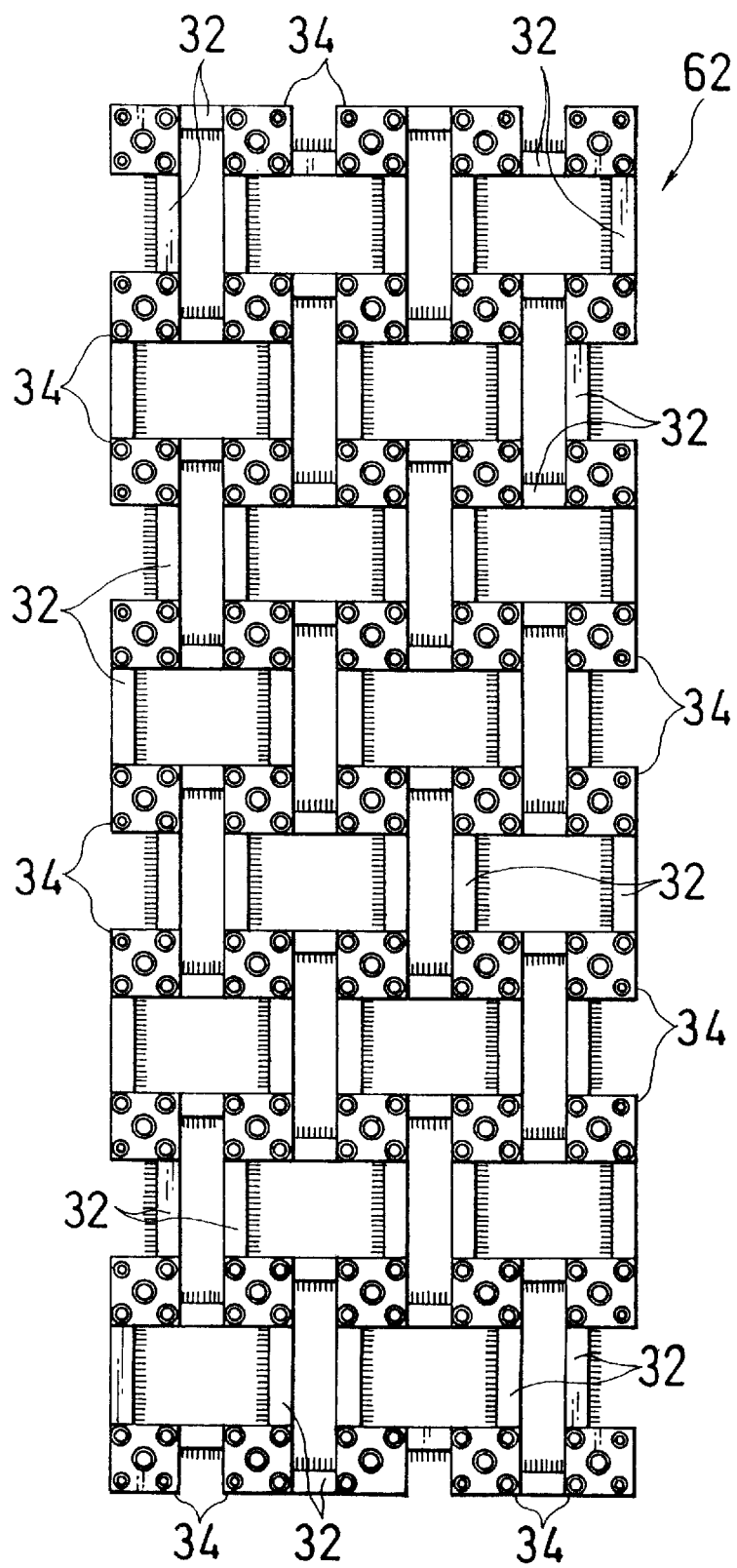
FIG. 6 is a plan view showing an embodiment of a probe assembly for use in the probe card shown in FIG. 1.

Subsequently, each screw member 54 is mated with the threaded hole 50 via the through hole 56 of the probe block 32. With this, each probe block 32 is joined to a predetermined cross joint 34. That is, the lattice sub-assembly as defined above is completed. In this way, as shown in FIG. 6, a lot of probe blocks 32, i.e., lattice sub-assemblies are put together to have a substantially lattice-like shape as a whole, thereby forming a probe assembly 34 including a number of probes 44 arranged substantially in the lattice-like shape. Each lattice sub-assembly consisting of four probe blocks 32 joined to one cross joint 34 is firmly combined with other lattice sub-assemblies by means of the same cross joint 34.

Then, each screw member 58 is mated with a predetermined threaded hole 60 of the cross joint 34 via the through hole 64 (FIG. 3) of the printed circuit board 30.

Each cable 36 is made to penetrate through the slot 38 of the printed circuit board 30, and its one end portion is made to electrically connect with a corresponding probe group. This process may be carried out before setting up the probe assembly 62 on the printed circuit board 30, preferably before joining the probe block 32 with the cross joint 34. It is more preferable, however, that this process be completed in advance of the above two steps. Then, each cable 36 is electrically connected with the connector 40 at its other end portion.

The height adjustment of the needle point between probe blocks and the positional adjustment of the probe 44 to the electrode portion 22 may be carried out before setting up the probe assembly 62 on the printed circuit board 30 or on the way to do the same. It is preferable, however, that those adjustments be carried out before setting up the probe assembly 62 on the printed circuit board 30, especially on the way to assemble the probe blocks 32, i.e., the lattice sub-assembly in the cross-like or lattice-like form.

As shown in FIG. 8, the probe assembly 62 is set up on the printed circuit board 30 such that respective needle points of the probes 44 belonging to one probe group and the same belonging to the other probe group of each probe block 32 are oppositely positioned across the corresponding boundary line 16 or 18.

Therefore, one and the other probe group of each probe block 32 respectively correspond to one and the other electrode portions 22 adjacent to each other of the chips located side by side in the thickness direction of the supporter 46, and the needle points of the probes 44 are pressed against the electrode portion 22 of the corresponding electrode group.

The probe card 10 is installed on a test equipment such that the probe group of each probe block 32 located around the intersection portion 20 corresponds to the electrode group formed along the boundary line 16 or 18 among electrode groups of four chips arranged side by side across each of the boundary lines 16 and 18, and that the needle points of each probe 44 can be pressed against the electrode portion 22 of corresponding electrode group.

In order to enable to test all the chips 14 formed on a semiconductor wafer 12 simultaneously, the probe card 10 may be provided with the same number of probes as the number of the electrodes 22 existing on the semiconductor wafer 12. Doing so, however, requires too many probes. As a result, the electrical load applied to the electric circuit of the tester becomes excessive, and it will be highly possible that the probe card 10 receives a damage due to the breakdown of the probe. Therefore, the probe card 10 may be constructed such that the electrical test of all the chips formed on one semiconductor wafer can be completed by repeating the test a few times (for example, two or three times).

According to the probe card 10 of the invention, since four probe blocks 32 radially extending from the intersection portion 20 along the boundary line 16 or 18 have their respective probes 44 projected in the same direction like the vanes of a windmill, four probe blocks 32 combined with the same cross joint 34, especially the probe 44 and the supporter 46, do not interfere with the work for putting a plurality of probe blocks 32, i.e., the lattice sub-assemblies together when assembling the probe assembly 62 in the lattice-like form. Thus, it is possible to test simultaneously four chips arranged side by side across each of intersecting imaginary boundary lines 16 and 18.

Furthermore, since all the probes 44 of each probe block 32 are made to project from the supporter 46 on its same side, the work for setting up the probes 44 on each supporter 46 is facilitated.

Still further, each of four probe blocks 32 joined by the cross joint in the cross-like form so as to radially extend from the intersection portion 20, can be made to correspond to the boundary line 16 or 18 which also radially extends from the intersection portion 20. Therefore, the work for setting up the probes 44 on each supporter 46 can be carried out more easily.

Still further, according to the invention, the four probe blocks 32 are joined at their end portions with the cross joint 34 and firmly fixed thereto by a screw to form the lattice sub-assembly. Then, a plurality of lattice sub-assemblies are put together by means of plural cross joints 34 to form a probe assembly 62 having the lattice-like form. Subsequently, this probe assembly 62 is set up on the printed circuit board 30. Accordingly, the above-mentioned steps remarkably facilitate the work for setting up the probe blocks 32 on the printed circuit board 30 in comparison with the work for setting up the probe blocks 32 directly on the printed circuit board 30.

As has been discussed so far, the probe assembly 62 is formed by using a predetermined number of lattice sub-assemblies. Alternatively, however, another probe assembly may be constructed in the lattice-like form by using a plurality of probe blocks 32, which are joined to a plurality of long cross joints elongated in the X-direction (or Y-direction) instead of the cross joint 34 as has been described so far.

Figure 9:
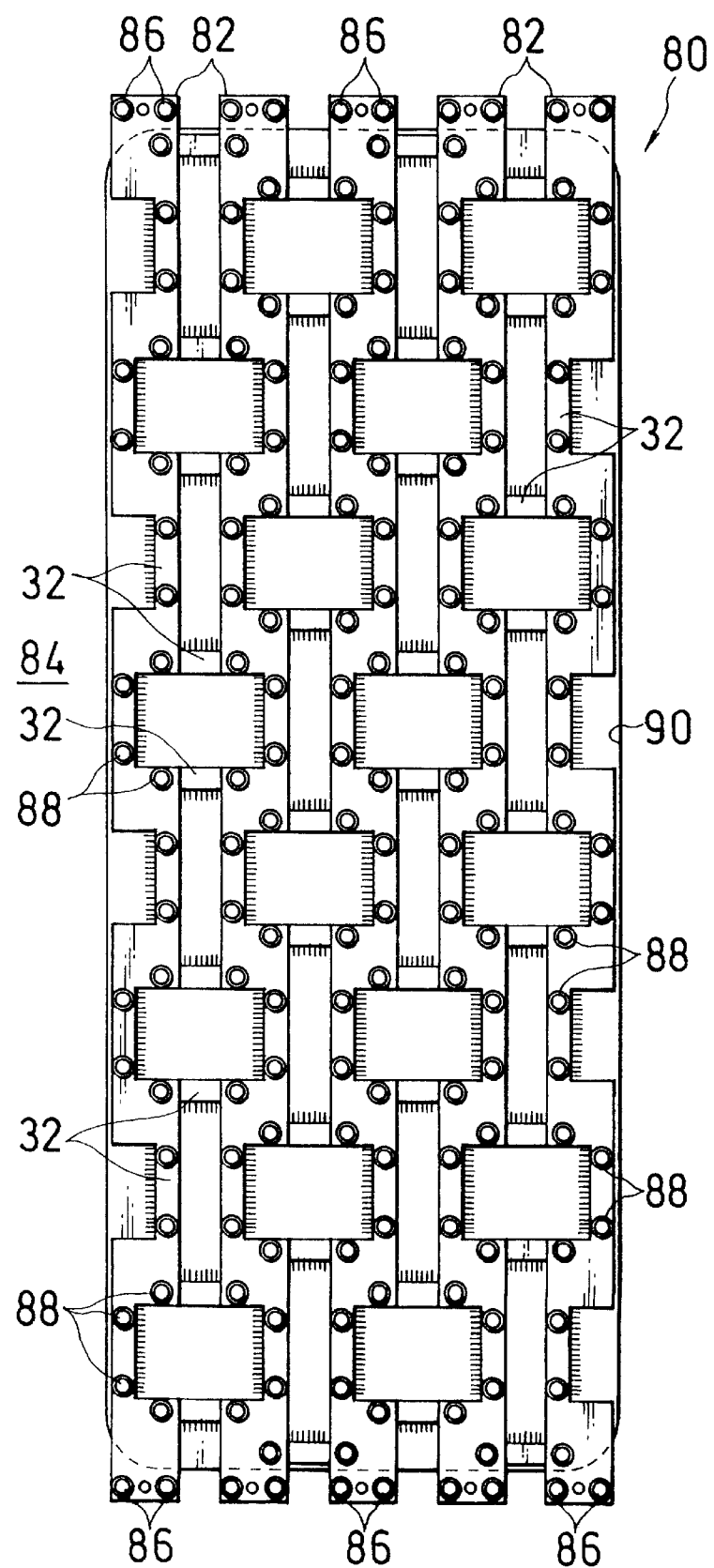
FIG. 9 is a plan view showing another embodiment of the probe assembly.
Figure 10:
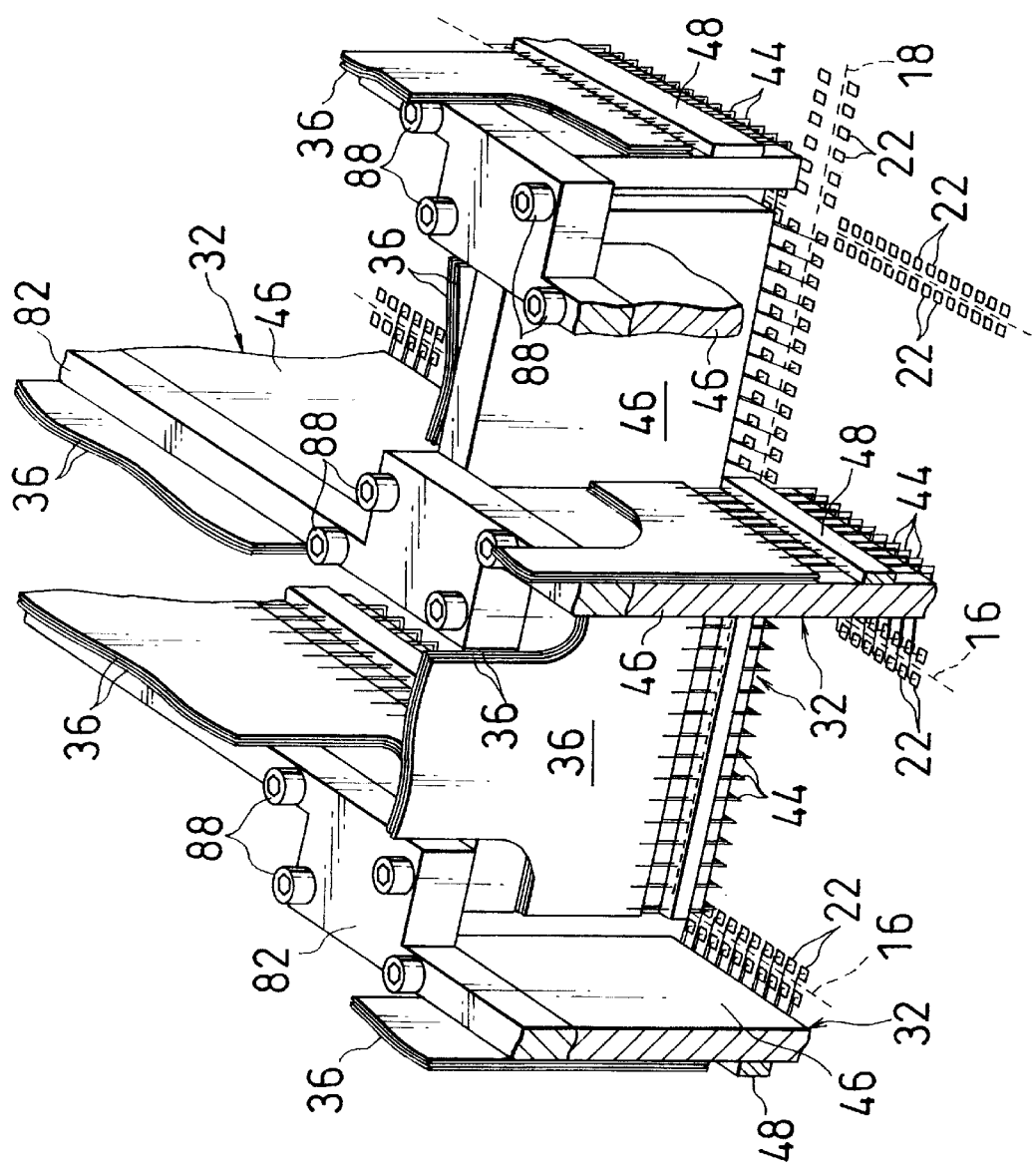
FIG. 10 is a partially enlarged perspective view of the probe assembly shown in FIG. 9.

FIGS. 9 and 10 show an embodiment of a probe assembly 80 as described above. This probe assembly 80 includes a plurality of long frames elongated in the Y-direction (or X-direction) for fixing probe blocks i.e. long cross joints 82 which are arranged on a printed circuit board 84, i.e., a base plate in parallel at intervals, and a plurality of probe blocks 32 are respectively fixed to the cross joints 82 so as to extend to the underside of the cross joint 82, drawing parallel line-like patterns, and a plurality of probe blocks 32 of the same kind fixed between adjacent cross joints 82 at intervals in the X-direction (or Y-direction).

Each cross joint 82 is fixed, through its both end portions in its longitudinal direction, to the upper side of a printed circuit board 84 by means of a plurality of screw members 86. Each probe block 32 is fixed, through its both end portions, to the same cross joint 82 or across adjacent cross joints 82 by using screw members 88 so as to extend downward from respective cross joints. For this reason, there are formed on the printed circuit board 84 substantially a rectangular opening 90 for allowing all the probe blocks 32 to project downward.

The probe card using the probe assembly 80 can form a structure having the lattice-like form by screwing a plurality of probe blocks 32 on corresponding cross joints 82, so that the work for assembling the probe assembly 80 is carried out more easily.

Figure 11:
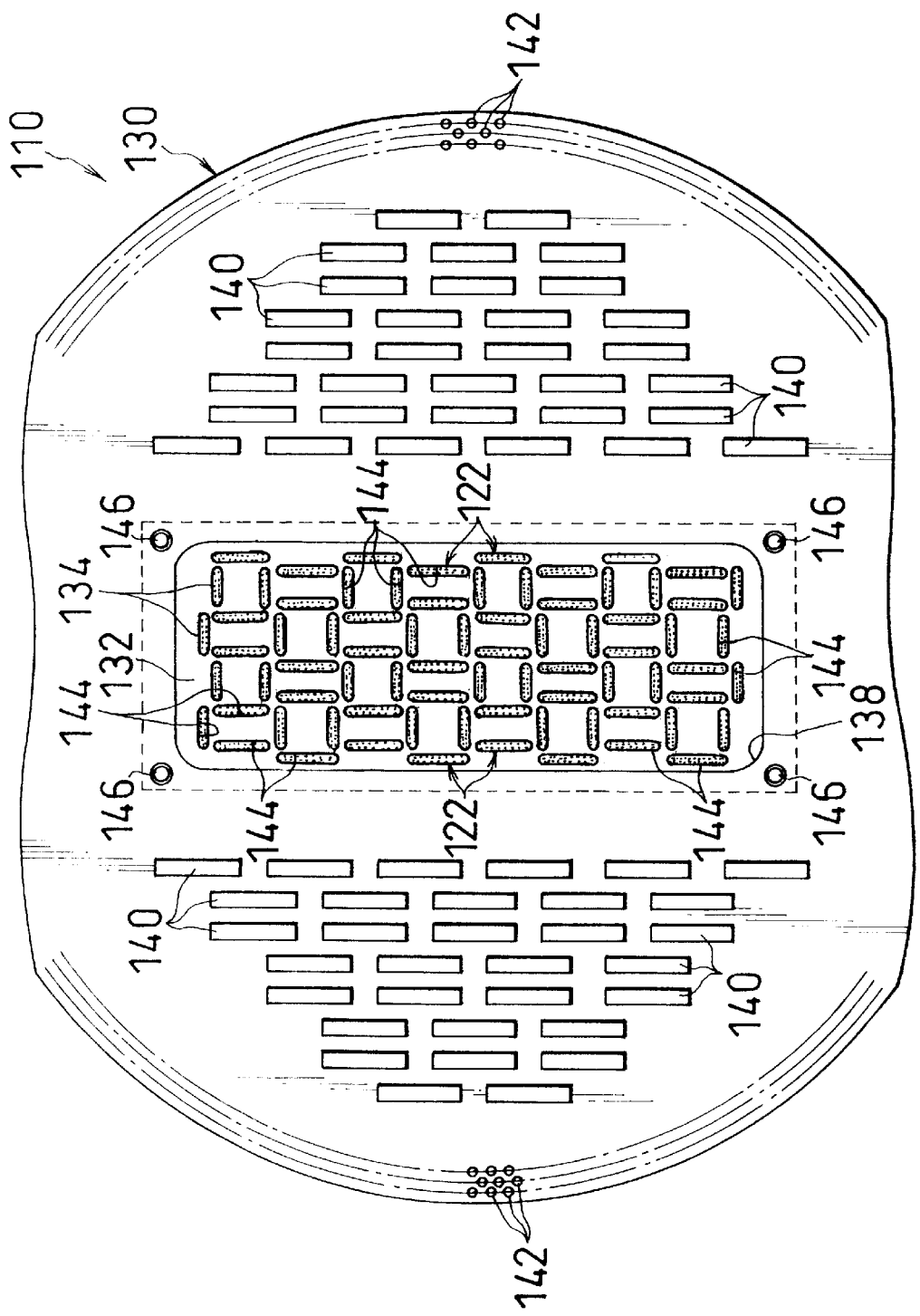
FIG. 11 is a plan view of a probe card shown without cables, according to another embodiment of the invention.
Figure 12:
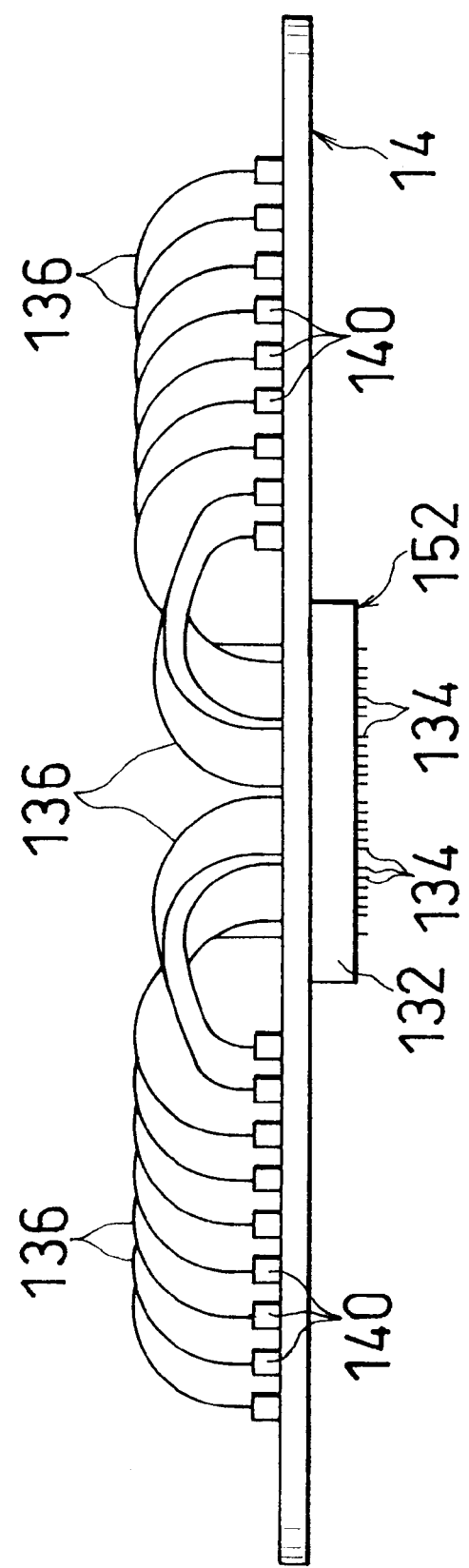
FIG. 12 is an elevational view of the probe card shown in FIG. 11.
Figure 16:
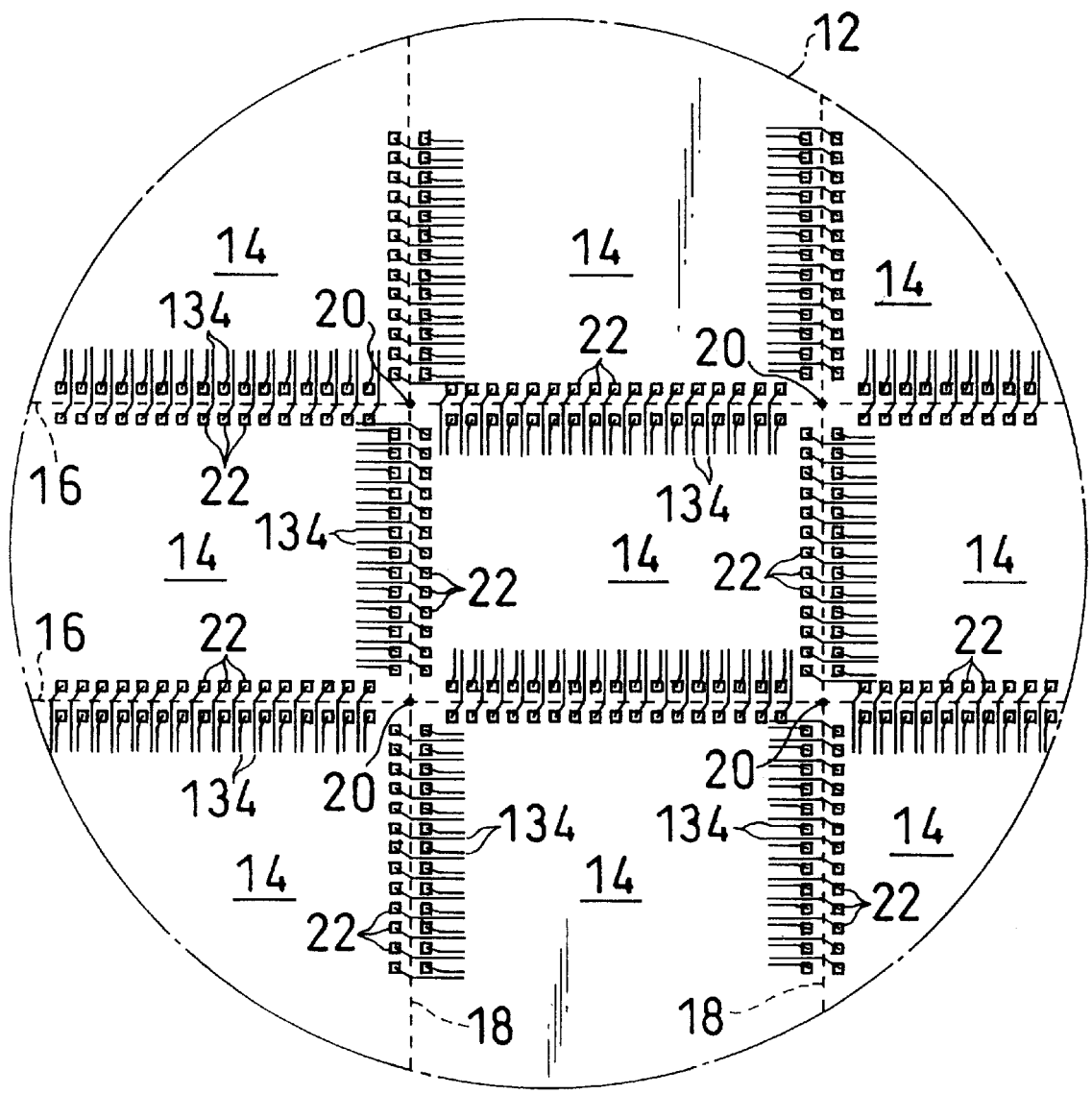
FIG. 16 is an illustration showing the relation between the probe and the electrode portion of a chip in the probe assembly as used for the probe card shown in FIG. 11, FIGS. 17a–17c are sectional views of possible embodiments of the probe.

Referring to FIGS. 11 and 12, a probe card 110 as shown in these figures can be used for electrically testing a lot of IC chips 14 formed on the semiconductor wafer 12 as shown in FIG. 16 in part. The probe card 110 comprises a plurality of probe blocks 122 disposed substantially in a lattice-like form.

The probe card 110 includes a circular printed circuit board 130, i.e., a base plate, an electrical insulating plate 132 arranged on the underside of the circular printed circuit board 130, a plurality of probes 134, and a plurality of cables 136 respectively connected with the probes 134.

The printed circuit board 130 includes a plurality of rectangular openings 138 provided in its center portion, a plurality of connectors 140 located around the openings and electrically connected with the end portion of the cable 136, and a plurality of tester lands 142 electrically connected with a tester (not shown) and arranged in the outer peripheral portion of the printed circuit board 130.

Each opening 138 penetrates through the printed circuit board 130 in the thickness direction thereof. Each connector 140 has a plurality electrical contacts and arranged on the upper side of the printed circuit board 130. Each electrical contact of the connector 140 is electrically connected with the tester land 142 via a wiring portion drawn in a predetermined wiring pattern on the printed circuit board 130.

As shown in FIGS. 11, 13, 14 and 15, the insulating plate 132 has a plurality of slots 144 extending along the imaginary boundary lines 16 and 18. These slots 144 are located in such positions as they make a substantially lattice-like shape. Each slot 144 corresponds to one edge of the chip to be electrically tested. The insulating plate 132 is attached to the underside of the printed circuit board 130 by means of a plurality of screw members 146 so as to close the openings 138.

Figure 14:
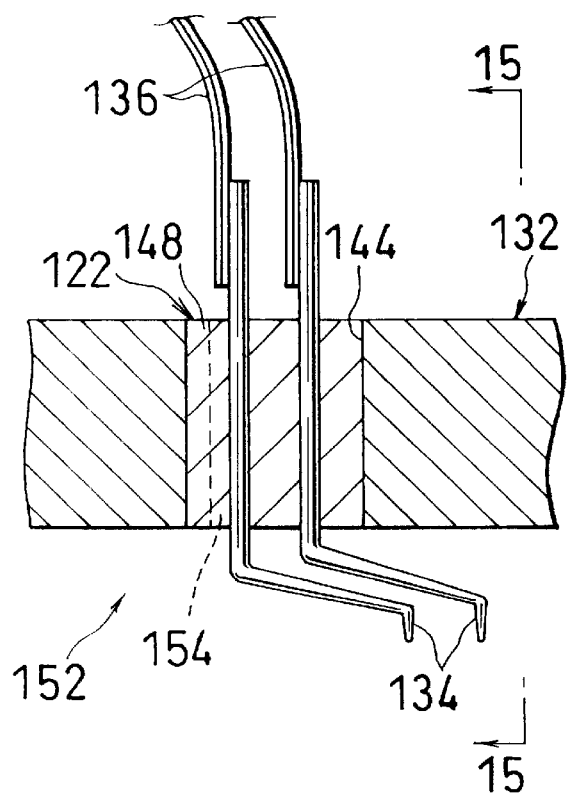
FIG. 14 is a sectional view taken along the line 14—14 in FIG. 13.

Each probe 134 is also made of a fine conductive metal wire material in the form of a needle, and as shown in FIG. 14, it bends its needle point part to be pressed on the electrode portion 22 of the chip 14, in one direction with respect to its principal needle body part, and also bends its needle rear part in the other direction opposite to the bending direction of the needle point part with respect to the principal needle body part.

Each probe 134 is adhered to the insulating plate 132 through its needle rear part by means of the adhesive 148 disposed in the slot 144 such that its needle rear part extends in the up and down directions through the slot 144, its principal needle body part passes through under the slot 144 to extend in the widthwise direction of the slot 144, and further, its needle point part extend downward under the insulating plate 132.

Figure 13:
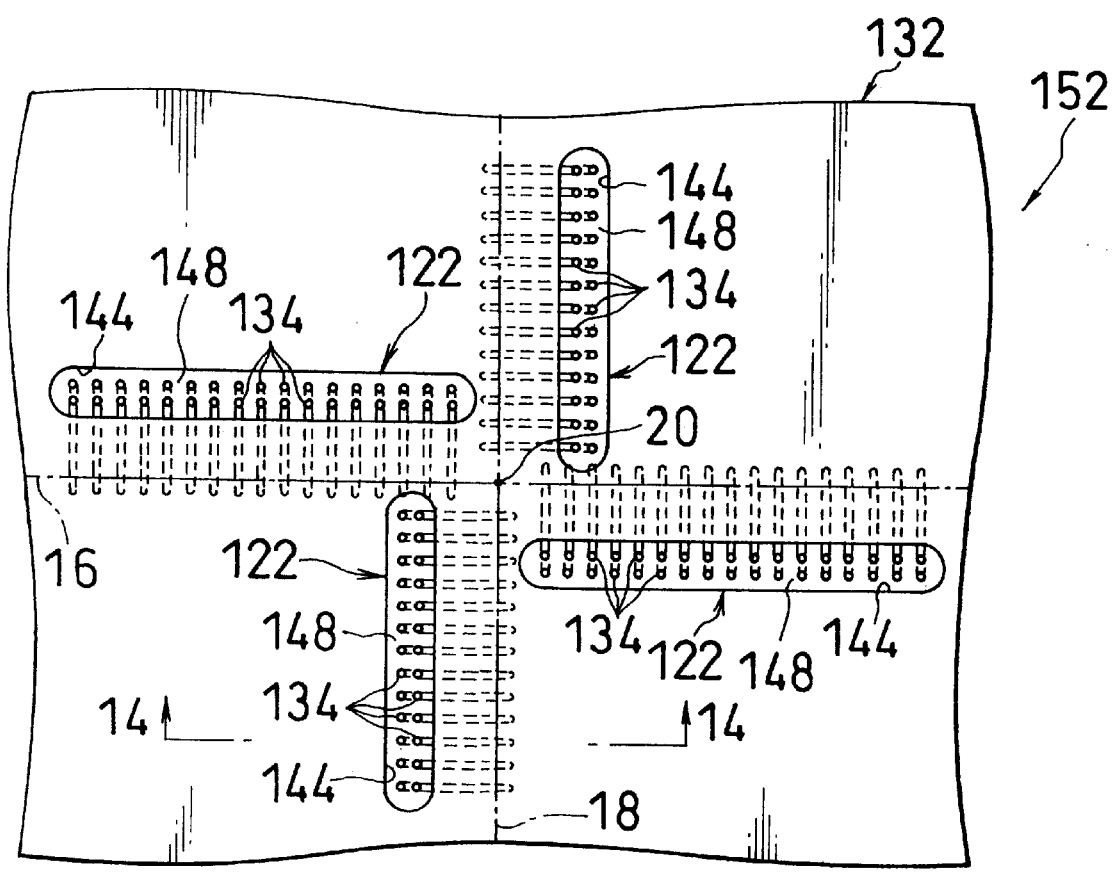
FIG. 13 is an enlarged plan view showing the vicinity of the cross-like intersection made by two imaginary lines.

As shown in FIGS. 13 and 16, the probes 134 penetrating through each slot 144 are divided into two groups, that is, the first probe group including a plurality of probes 134 putting their needle points on one side of the boundary line 16 or 18, and the second probe group including a plurality of probes 134 putting their needle points on the other side of the boundary line 16 or 18.

Therefore, all the needle points of the probes 134 belonging to the first probe group and all the needle points of the probes 134 belonging to the second probe group leave a predetermined space therebetween in the widthwise direction of the slot 144 (i.e., X- or Y-direction) but are located on the same side with respect to the widthwise direction of the slot 144.

In the example as shown, the needle points of the probes 134 belonging to the first and second probe groups are aligned in the direction of corresponding slots 144 on the group by group basis. However, the needle points of the probes 134 belonging to the first and second probe groups may be arranged so as to draw a zigzag line or multiple lines. Also, the probes 134 of the first and second probe groups and an adhesive 148 adhering these probes 134 to the slots 144 constitute probe blocks 122.

The probes 134 of four pairs of the probe blocks 122 located around the intersection portion 20 of the boundary lines 16 and 18 (i.e., the intersection portion of the lattice) are positioned such that the front side portions including the principal needle body parts of the probes 134 extend, around the intersection portion 20, in the same direction (like the vanes of a windmill) with respect to the position of the principal needle body part attached to the insulating plate 132. Thus, the needle point parts of four pairs of the probe blocks 122 are positioned so as to be rotationally symmetric with respect to the intersection portion 20.

The first and second probe groups penetrating through each slot 144 are respectively arranged side by side with respect to the widthwise direction of the slot 144 (X- or Y-direction). In other words, they correspond to one and the other electrode groups arranged side by side across the boundary line 16 or 18.

Figure 15:
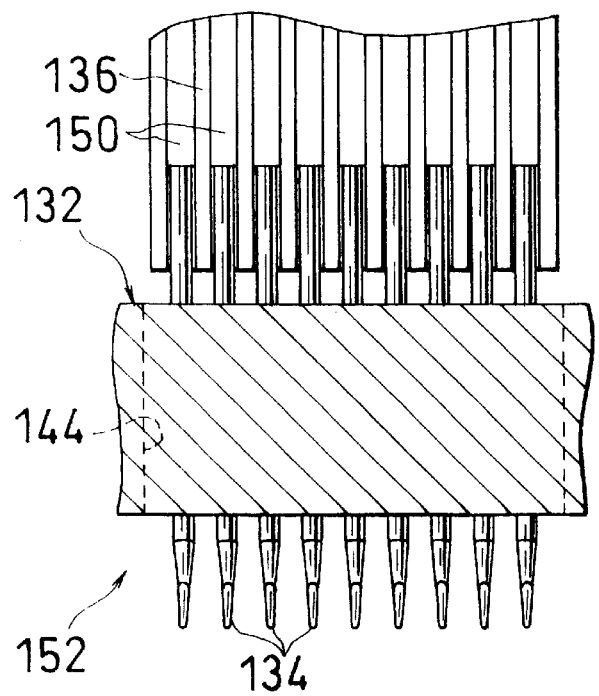
FIG. 15 is a sectional view taken along the line 15—15 in FIG. 14.

As shown in FIG. 15, each cable 136 is also a flexible flat cable (so-called FPC) including a plurality of conductive portions 150 which are formed in parallel with each other printed on the insulating film by means of the print wiring technique. This cable 136 is provided for all the probe groups on the group by group basis. Each conductive portion 150 is electrically connected with the rear end portion of the corresponding probe 134 and is also electrically connected with the electrical contacts of the corresponding connector 140.

The probe card 110 can be assembled through the following steps: first, preparing the printed circuit board 130, the probes 134, and cables 136; then, arranging the probes 134 on the insulating plate 132 in the manner as described above, thereby completing probe assemblies 152; and screwing the insulating plate 132 having probe assemblies 152 on the printed circuit board 130.

When arranging the probes 134 on the insulating plate 132, all the front side portions of the probes 134 are arranged so as to extend, around the intersection portion 20, in the same direction with respect to the position of the probe adhered to the insulating plate 132 by means of the adhesive 148. With this, the front side portions of four pairs of the probe blocks 122 located around the intersection portion 20 come to extend in the same direction as the vanes of a windmill.

Furthermore, as shown in FIGS. 13 and 16, when arranging the probes 134 on the insulating plate 132, the probes 134 of the first and second probe groups penetrating through each slot 144 are adhered to the insulating plate 132 such that their needle points are positioned opposing to each other across the boundary line 16 or 18.

As shown in FIGS. 14 and 15, after screwing the insulating plate 132 on the printed circuit board 130, each cable 136 electrically connects each conductive portion 150 thereof with the needle end part of each probe 134. However, this electrical connection of the cable 136 may be carried out before fitting the probes 134 to the insulating plate 132 or screwing the insulating plate 132 on the printed circuit board 130. Each cable 136 is electrically connected with the corresponding connector 140, eventually.

The height adjustment of the needle point and the positional adjustment of the probe 134 to the electrode portion 22 are carried out when setting up the probe 134 on the insulating plate 132, and also carried out when setting up the probe assemblies 152 on the printed circuit board 130.

Instead of directly letting probes 134 penetrating through each slot 144 stand upright through the corresponding slot 144 with the help of the adhesive 148, it is possible, as shown in FIG. 14, to first stand those probes 134 upright through the base 154 with the help of the adhesive, thereby forming probe blocks 122, and then, adhering these probe blocks 122 to the corresponding slots 144 with the adhesive. By so doing, the work for fitting the probes 134 to each slot 144 can be carried out more easily.

The probe card 110 is installed on a test equipment such that the needle points of the probe 134 of the first and second groups penetrating through each slot 144 oppose to one and the other of the electrode portions of the chips 14 arranged side by side across the boundary line 16 or 18, and the needle points of each probe 134 can be pressed against the electrode portion 22 of corresponding electrode group.

In order to enable to test all the chips 14 formed on a semiconductor wafer 12 simultaneously, the probe card 110 may be provided with the same number of probes as the number of the electrodes 22 existing on the semiconductor wafer 12. Doing so, however, requires too many probes. As a result, the electrical load applied to the electric circuit of the tester becomes excessive, and there might be a high possibility that the probe card 110 receives a damage due to the breakdown of the probe. Therefore, the probe card 110 may be constructed such that the electrical test of all the chips on one semiconductor wafer is completed by repeating the test a few times (for example, two or three times).

According to the probe card 110 of the invention, since the probes 134 of four pairs of the probe blocks 122 around the intersection portion 20 project their front side portions in the same direction like the vanes of a windmill, the probe 134 of one blocks 122 do not interfere with the work for fitting the probe 134 of the other blocks 122 located around the same intersection portion 20 and the probe 134 located around the other intersection portion 20 to the insulating plate. Thus, it is possible to test four chips arranged side by side across each of intersecting boundary lines 16 and 18 simultaneously.

Furthermore, since all the probes 134 penetrating through each slot 144 extend their front side portions on the same side, the work for fitting the probes 134 to the insulating plate 132 can be facilitated.

Still further, since the probe 134 can be fitted to the insulating plate 132 for each slot 144, it is not needed to use the supporter for fitting thereto the same number of probes as the number of the probes for use in a lot of chips. Thus, the number of the probes to be fitted to each slot 144 can be remarkably reduced.

Probes 44 and 134 may have such a circular cross section as shown in FIG. 17 (A). However, as shown in FIG. 17(B) or 17(C), a probe 134b having a flat cross section or a probe 134c having an elliptical cross section may be manufactured by means of a press machine or by punching it from a plate material. The latter probes may be arranged in their thickness direction. If the latter probes are employed, they can be arranged at a narrower pitch.

In any one of embodiments as described above, the cable 36 or 136 may be other cables than FPC such as a flat cable, a coaxial cable and so on as generally known. Instead of using the cable 36 or 136, there can be used the probe 44 or 134 having a longer needle rear portion, of which the rear end may be directly connected with the connector 40 or 140 or with the tester land 42 or 142.

In the embodiments as shown in FIGS. 1 through 10, the front side portions of all the probes 44 are arranged to project themselves from the supporter 46. However, it is not always necessary to project the front side portions of all or a part of the probe 44 from the supporter 46.

Likewise, in the embodiments as shown in FIGS. 11 through 17, the front side portions of all the probes 134 are arranged to project themselves from the position of the slot 144 in the widthwise direction of the slot 144. It is not always necessary, however, to project the front side portions of all or a part of the probes 134 from the position of the slot 144 in the widthwise direction of the slot 144.

Furthermore, in the embodiments as shown in FIGS. 1 through 10, all the probes 44 extend, around the intersection portion 20, their front side portions on the same side with respect to the fitting position of the probes to the supporter 46, as a windmill does its vanes. However, the probes 44 may be arranged so as to extend the front side portions of only a part of the probes 44 located in the vicinity of the intersection portion 20 on the same side relative to the fitting position of the probes to the supporter 46 as a windmill does its vanes, while they extend the remaining part of their front side portions on the other side relative to the fitting position of the probes to the supporter 46.

Likewise, in the embodiment as shown in FIGS. 11 through 17, all the probes 134 penetrating through each slot 144 extend, around the intersection portion 20, their front side portions on the same side as a windmill does its vanes. As shown in FIG. 18, however, the probes 134 may be arranged so as to extend the front side portions of only a part of the probes 134 located in the vicinity of the intersection portion 20 on the same side as a windmill does its vanes, while they extend the remaining part of their front side portions on the other side.

The invention should not be limited to the embodiments as have been discussed so far. The invention may be variously changed and modified without departing from the gist thereof.

What is claimed is:

1. A probe card comprising:
   a base plate,
   a plurality of probe blocks having first and second probe groups including a plurality of probes, respectively, said probe blocks being fitted to said base plate substantially in a lattice-like form,
   wherein individual probes have a needle point part and a needle rear part, wherein respective needle points of the probes belonging to the first and second probe groups are located on one and the other sides of each of imaginary boundary lines, and wherein a plurality of said probe blocks located around a lattice intersection portion are fitted to said base plate such that the needle point parts of the probes located in the vicinity of said intersection portion are positioned in the same direction, around said lattice intersection portion, in either a clockwise or counterclockwise direction, with respect to the respective needle rear parts.

2. A probe card as claimed in claim 1, wherein each probe block has a front facing portion corresponding to the vertical side of the probe block adjacent to the needle point part and wherein the plurality of probe blocks located around said lattice intersection portion are fitted to said base plate such that the front facing portions are positioned in the same direction, around said lattice intersection portion, in either a clockwise or counter-clockwise direction, with respect to the respective needle rear parts.

3. A probe card as claimed in claim 1, further comprising a probe set-up means having a plurality of cross joints for fitting said probe blocks to said base plate in the lattice-like form, wherein each of said probe blocks is further provided with a supporter for supporting said probes.

4. A probe card as claimed in claim 3, wherein said blocks located around said lattice intersection portion are fitted to said base plate such that the needle point parts of their probes extend, around said lattice intersection portion, in the same direction relative to the fitting position of the probes to the supporter, in either a clockwise or counter-clockwise direction.

5. A probe card as claimed in claim 3, wherein a plurality of probe blocks located around said lattice intersection portion include four probe blocks which radially extend and are joined together substantially in a cross-like shape.

6. A probe card as claimed in claim 5, wherein each cross joint joins four probe blocks together substantially in a cross-like shape and fits said joined four blocks to said base plate.

7. A probe card as claimed in claim 5, wherein said cross joints are arranged on said base plate at intervals in a first direction and extend in parallel in a second direction intersecting said first direction, wherein each cross joint joins a plurality of probe blocks together such that they extend substantially in said second direction, and wherein adjacent cross joints join a plurality of another probe blocks together such that they extend in said first direction at intervals in said second direction.

8. A probe card as claimed in claim 5, wherein each probe block is screwed on one of said cross joints, and each cross joint is screwed on said base plate.

9. A probe card as claimed in claim 1, further comprising a probe set-up means, wherein said probe set-up means includes an insulating plate fitted to said base plate, said insulating plate having a plurality of slots which extend along two imaginary boundary lines intersecting each other and are arranged substantially in the lattice-like form, and wherein the probes of each probe block are fitted to said insulating plate so as to penetrate through said slot.

10. A probe card as claimed in claim 9, wherein four pairs of the first and second probe groups located around said lattice intersection portion are fitted to said base plate such that the needle point parts extend, around said lattice intersection portion, in the same direction relative to the fitting position of the probes to the insulating plate, in either a clockwise or counter-clockwise direction.

11. A probe card as claimed in claim 9, each of said probe blocks further includes a base to which the probes penetrating through each slot are adhered, said base being arranged in said slot and adhered thereto.

12. A probe card as claimed claim 1, further including a plurality of cables which correspond to each probe group and are connected with the probes of the corresponding probe group.

13. A probe card as claimed in claim 12, wherein said base plate includes a plurality of connectors arranged around said probe blocks and connected with said cable, and a plurality of tester lands formed around said connectors and respectively connected with said connectors.

14. A probe card comprising:

a base plate, a plurality of probe blocks having a front facing portion, said probe blocks being fitted to said base plate substantially in a lattice-like form, a plurality of probes connected to said probe blocks, wherein individual probes have a needle point part and a needle rear part, a plurality of cross joints for fitting said probe blocks to said base plate in the lattice-like form, wherein each front facing portion corresponds to a vertical side of the probe block adjacent to the connected needle point parts, and wherein the plurality of probe blocks located around said lattice intersection portion are fitted to said base plate such that the front facing portions are positioned in the same direction, around said lattice intersection portion, in either a clockwise or counter-clockwise direction, with respect to the needle rear part.

15. A probe card comprising:

a base plate, a plurality of probe blocks having a probe group including a plurality of probes, said probe blocks being fitted to said base plate substantially in a lattice-like form, wherein individual probes have a needle point part and a needle rear part, a probe set-up means, wherein said probe set-up means includes an insulating plate fitted to said base plate, said insulating plate having a plurality of slots which extend along two imaginary boundary lines intersecting each other and are arranged substantially in the lattice-like form, wherein the probes of each probe block are fitted to said insulating plate so as to penetrate through the slot, and wherein the probe groups located around said lattice intersection portion are fitted to said base plate such that the needle point parts extend, around said lattice intersection portion, in the same direction relative to the fitting position of the probes to the insulating plate, in either a clockwise or counter-clockwise direction.

* * * * *